(12) United States Patent
Lee et al.

(10) Patent No.: US 10,318,678 B2
(45) Date of Patent: Jun. 11, 2019

(54) METHOD OF THREE-DIMENSIONAL OPTOELECTRICAL SIMULATION OF IMAGE SENSOR

(71) Applicant: SAMSUNG ELECTRONICS CO., LTD., Suwon-si (KR)

(72) Inventors: Wook Lee, Suwon-si (KR); Han-Gu Kim, Seongnam-si (KR); Young-Keun Lee, Anyang-si (KR); Jong-Sung Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1236 days.

(21) Appl. No.: 14/254,337

(22) Filed: Apr. 16, 2014

(65) Prior Publication Data

US 2014/0316760 A1    Oct. 23, 2014

(30) Foreign Application Priority Data

Apr. 19, 2013  (KR) .................. 10-2013-0043664

(51) Int. Cl.
*G06F 17/50*    (2006.01)

(52) U.S. Cl.
CPC .................. *G06F 17/5036* (2013.01)

(58) Field of Classification Search
CPC ................................................. G06F 17/5036
USPC .......................................................... 703/13
See application file for complete search history.

(56) References Cited

FOREIGN PATENT DOCUMENTS

| JP | 2005-203400 A | 7/2005 |
| KR | 10/0467978 B1 | 1/2005 |

OTHER PUBLICATIONS

Tsen, Kong-Thon et al, "Improvement of crosstalk on 5M CMOS image sensor with 1.7x1.7μm² pixels," Proc. SPIE, Feb. 9, 2007, pp. 1-2.
Essa, Z. et al, "3D TCAD Simulation of Advanced CMOS Image Sensors," IEEE, 2011, pp. 187-190.
Jacob, Biju et al, "CMOS detectors: TCAD simulation of image sensors catches light in silicon," LaserFocusWorld, pp. 1-7.

*Primary Examiner* — Saif A Alhija
(74) *Attorney, Agent, or Firm* — Sughrue Mion, PLLC

(57) ABSTRACT

A three-dimensional optoelectrical simulation includes generating a process simulation result including a doping profile of a silicon substrate of image sensor, a structure simulation result with respect to a back end of line structure, and a merged result generated by merging a process simulation result and a structure simulation result, selectively extending the merged result to an extended result by using a process simulation result or a structure simulation result, generating a segmented result for each pixel based on a merged result or an extended result, an optical crosstalk simulation result of image sensor based on a structure simulation result and an optical mesh, and a final simulation result including an electrical crosstalk simulation result of the image sensor based on a segmented result for each pixel and an optical crosstalk simulation result.

12 Claims, 7 Drawing Sheets

METHOD OF THREE-DIMENSIONAL OPTOELECTRICAL SIMULATION OF IMAGE SENSOR

CROSS-REFERENCE TO RELATED APPLICATION

This application claims priority under 35 USC § 119 from Korean Patent Application No. 10-2013-0043664, filed on Apr. 19, 2013, in the Korean Intellectual Property Office (KIPO), the disclosure of which is incorporated herein by reference in its entirety.

BACKGROUND

1. Technical Field

Methods and apparatuses consistent with embodiments relate to an image sensor, and more particularly to three-dimensional optoelectrical simulation of an image sensor.

2. Discussion of the Related Art

As a pixel size of an image sensor is reduced, it becomes important to achieve exact prediction of crosstalk among neighboring pixels in a three-dimensional optoelectrical simulation to design the image sensor. The crosstalk of the image sensor may include color filter crosstalk, optical crosstalk, and electrical crosstalk. Exact prediction of the color filter crosstalk and the optical crosstalk may be obtained using 2×2 pixel array having bayer pattern, which is widely used, but prediction accuracy of the electrical crosstalk may be degraded.

SUMMARY

Aspects of the exemplary embodiments provide a method of a three-dimensional optoelectrical simulation having improved prediction accuracy of crosstalk in an image sensor.

Aspects of the exemplary embodiments also provide a method of a three-dimensional optoelectrical simulation having improved prediction accuracy of crosstalk in an image sensor, reduced running time, and reduced memory requirement.

According to an aspect of an exemplary embodiment, a method of a three-dimensional optoelectrical simulation of an image sensor includes, generating a process simulation result including a doping profile of a silicon substrate of the image sensor; generating a structure simulation result with respect to a back end of line (BEOL) structure formed by a BEOL process of the image sensor; generating a merged result by merging the process simulation result and the structure simulation result; selectively extending the merged result to an extended result by using the process simulation result or the structure simulation result; generating a segmented result for each pixel based on the merged result or the extended result; generating an optical crosstalk simulation result of the image sensor based on the structure simulation result and an optical mesh; and generating a final simulation result including an electrical crosstalk simulation result of the image sensor based on the segmented result for each pixel and the optical crosstalk simulation result.

The final simulation result may further include a photocurrent value of the image sensor and a quantum efficiency of the image sensor.

The BEOL structure may include interconnection metal lines.

The BEOL structure may further include a micro-lens of the image sensor.

The BEOL structure may further include a color filter of the image sensor.

The method may be performed for a 4×4 pixel array included in the image sensor.

Generating the process simulation result may comprises generating the process simulation result of a 2×2 pixel array, generating the structure simulation results comprises generating the structure simulation result of a 4×4 pixel array such that the 4×4 pixel array includes the 2×2 pixel array at a center of the 4×4 pixel array, extending the merged result comprises extending the merged result to the extended result of the 4×4 pixel array including an extended process simulation result of the 4×4 pixel array such that the extended process simulation result is formed by using the process simulation result of the 2×2 pixel array, generating the segmented result comprises generating the segmented result for each pixel of the 4×4 pixel array based on the extended result of the 4×4 pixel array, generating the optical crosstalk simulation result comprises generating the optical crosstalk simulation result of the 4×4 pixel array, and generating the final simulation result comprises generating the final simulation result of the 2×2 pixel array may based on the segmented result for each pixel of the 4×4 pixel array and the optical crosstalk simulation result of the 4×4 pixel array.

According to an aspect of an exemplary embodiment, a method of a three-dimensional optoelectrical simulation of an image sensor includes, generating a process simulation result including a doping profile of a silicon substrate of the image sensor; generating a structure simulation result with respect to a back end of line (BEOL) structure that is formed by a BEOL process of the image sensor; generating a merged simulation result by merging the process simulation result and the structure simulation result; generating an optical crosstalk simulation result of the image sensor based on the structure simulation result and an optical mesh; generating a merged result by merging the optical crosstalk simulation result and the merged simulation result; extending the merged result to an extended result by using the optical crosstalk simulation result or the merged simulation result; generating a segmented result for each pixel based on the extended result; and generating a final simulation result including an electrical crosstalk simulation result of the image sensor based on the segmented result for each pixel.

The final simulation result may further include a photocurrent value of the image sensor and a quantum efficiency of the image sensor.

Generating the process simulation result comprises generating the process simulation result for a 4×4 pixel array of the image sensor including a 2×2 pixel array at a center of the 4×4 pixel array, generating the structure simulation result comprises generating the structure simulation result of the 4×4 pixel array, generating the merged simulation result comprises generating the merged simulation result for the 4×4 pixel array, generating the optical crosstalk simulation result comprises generating the optical crosstalk simulation result of the 2×2 pixel array, extending the merged result comprises extending the merged result to the extended result of the 4×4 pixel array including an extended optical crosstalk simulation result of the 4×4 pixel array such that the extended optical crosstalk simulation result is formed by using the optical crosstalk simulation result of the 2×2 pixel array, generating the segmented result comprises generating the segmented result for each pixel of the 4×4 pixel array based on the extended result of the 4×4 pixel array, and generating the final simulation result comprises generating the final simulation result of the 2×2 pixel array based on the segmented result for each pixel of the 4×4 pixel array.

Generating the process simulation result comprises generating the process simulation result for a 2×2 pixel array of the image sensor including a one pixel, generating the structure simulation result comprises generating the structure simulation result for the 2×2 pixel array, generating the merged simulation result comprises generating the merged simulation result for the 2×2 pixel array, and generating the optical crosstalk simulation result comprises generating the optical crosstalk simulation result for the 2×2 pixel array, extending the merged result comprises extending the merged result to the extended result of a 3×3 pixel array including the one pixel at the center such that the extended result is formed by using the merged result of the 2×2 pixel array, generating the segmented result comprises generating the segmented result for each pixel of the 3×3 pixel array based on the extended result of the 3×3 pixel array, generating the final simulation result comprises generating the final simulation result of the one pixel based on the segmented result for each pixel of the 3×3 pixel array.

Generating the process simulation result comprises generating the process simulation result for a 2×2 pixel array of the image sensor located at a center of a 4×4 pixel array, generating the structure simulation result comprises generating the structure simulation result for the 2×2 pixel array, generating the merged simulation result comprises generating the merged simulation result for the 2×2 pixel array, generating the optical crosstalk simulation result comprises generating the optical crosstalk simulation result for the 2×2 pixel array, extending the merged result comprises extending the merged result to the extended result of the 4×4 pixel array such that the extended result is formed by using the merged result of the 2×2 pixel array, generating the segmented result comprises generating the segmented result for each pixel of the 4×4 pixel array based on the extended result of the 4×4 pixel array, generating the final simulation result comprises generating the final simulation result of the 2×2 pixel array based on the segmented result for each pixel of the 4×4 pixel array.

According to an aspect of an exemplary embodiment, there is provided a method of generating electrical crosstalk simulation result of a pixel array having a bayer pattern, the pixel array located within a larger pixel array, the method including generating a process simulation result of the larger pixel array, generating a back end of line (BEOL) structure simulation result of the larger pixel array, generating an optical crosstalk simulation result of the larger pixel array, and generating the electrical crosstalk simulation result of the pixel array based on the process simulation result of the larger pixel array, the BEOL structure simulation result of the larger pixel array, and the optical crosstalk simulation result of the larger pixel array.

BRIEF DESCRIPTION OF THE DRAWINGS

Exemplary embodiments will be more clearly understood from the following detailed description taken in conjunction with the accompanying drawings.

DETAILED DESCRIPTION OF THE EXEMPLARY EMBODIMENTS

Figure 1:
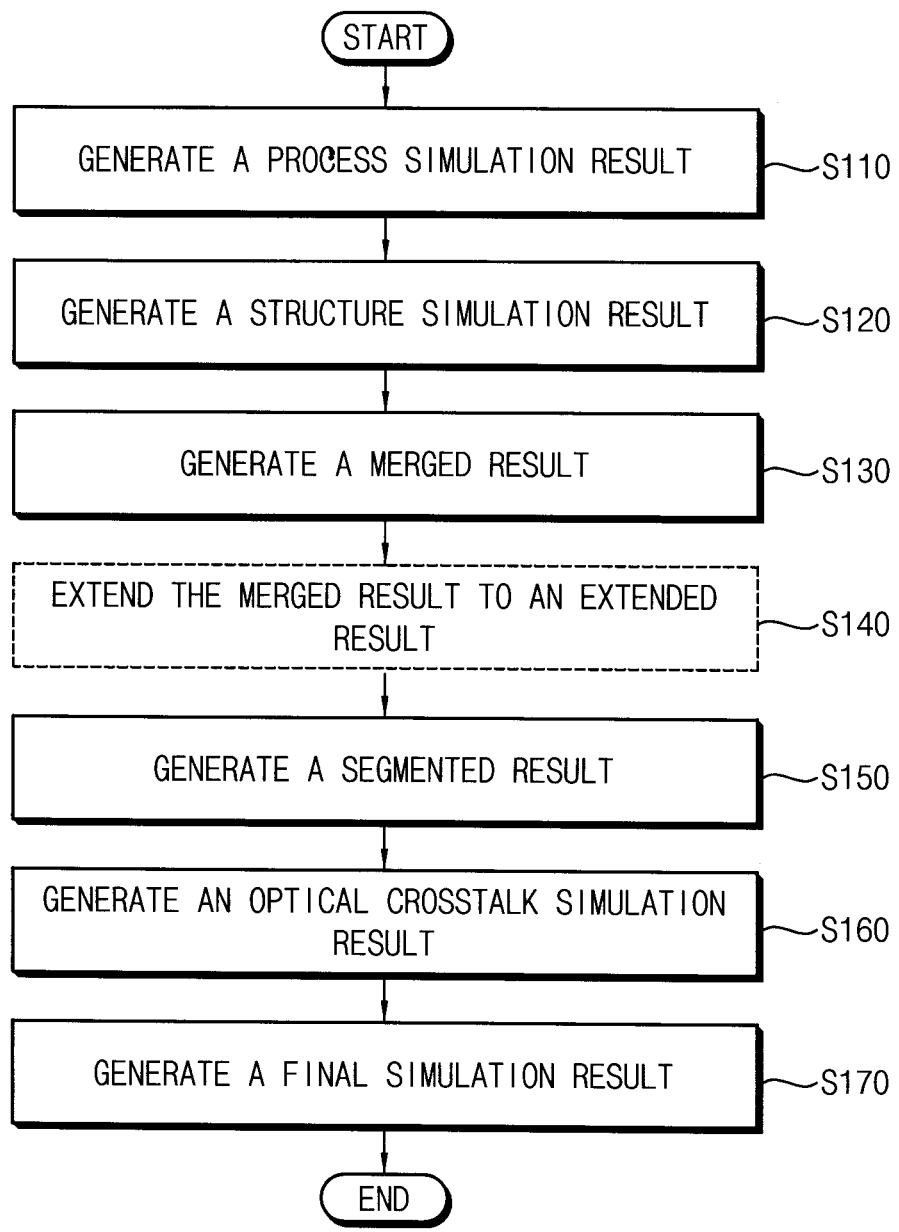
FIGS. 1 and 2 are flow charts illustrating methods of three-dimensional (3-D) optoelectrical simulation of an image sensor according to exemplary embodiments.

Exemplary embodiments will be described more fully hereinafter with reference to the accompanying drawings. The exemplary embodiments may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. In the drawings, the sizes and relative sizes of layers and regions may be exaggerated for clarity. Like numerals refer to like elements throughout.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
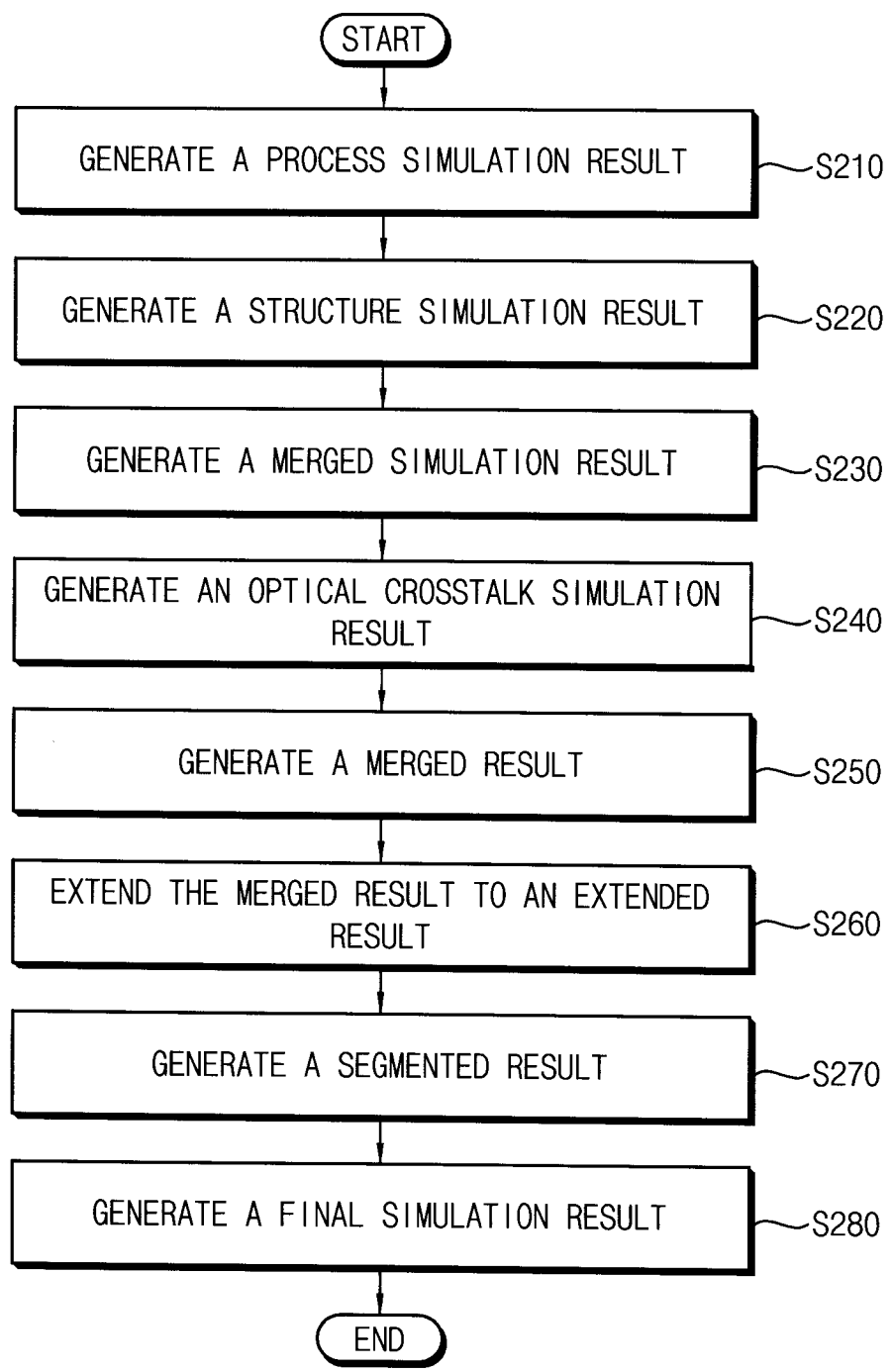

FIGS. 1 and 2 are flow charts illustrating methods of three-dimensional (3-D) optoelectrical simulation of an image sensor according to exemplary embodiments.

Referring to FIG. 1, a process simulation result is generated (S110) such that the process simulation result includes a doping profile of a silicon substrate of the image sensor. In general, the doping profile of the silicon substrate of the image sensor is optimally designed according to the wavelength of light (Red(R), Green(G), Blue(B)) that is incident on the pixel array of the image sensor. As a result, the process simulation result may include the doping profile that is optimally designed.

A structure simulation result is generated (S120) with respect to a back end of line (BEOL) structure that is formed by a BEOL process of the image sensor. Components such as transistors, capacitors, and resistors are implemented on a wafer during a front end of line (FEOL) process. The BEOL process is a process for interconnecting the components after the FEOL process. The BEOL structure formed by the BEOL process may include interconnection metal lines, micro-lenses, color filters, etc. The interconnection metal lines may transfer optical signals, which have been detected by pixels of the image sensor, to an image processor or an image storage device. Each color filter may select the light component, which is incident on each pixel and has wavelength according to the each color filter. Color filter crosstalk caused by the color filter and the BEOL structure including the interconnection metal lines, the micro-lens and the color filter will be described with reference to FIG. 3.

A merged result is generated (S130) by merging the process simulation result and the structure simulation result. The merged result is selectively extended to an extended result (S140) by using the process simulation result or the structure simulation result. A segmented result for each pixel is generated (S150) based on the merged result or the extended result for each pixel.

The extending and segmenting processes will be further described with reference to FIGS. 4, 5 and 6. As a result, the segmented result for each pixel is generated.

An optical crosstalk simulation result of the image sensor is generated (S160) based on the structure simulation result and an optical mesh. In general, the 3-D optoelectrical simulation is executed for the image sensor divided in units of polygons, called a mesh. A mesh, which is necessary to execute an optical crosstalk simulation of the image sensor, is called as the optical mesh. The optical crosstalk of the image sensor will be further described with reference to FIGS. 3 and 4.

A final simulation result is generated (S170) based on the segmented result for each pixel and the optical crosstalk simulation result such that the final simulation result includes an electrical crosstalk simulation result of the image sensor. The final simulation result may further include a photocurrent value and a quantum efficiency in addition to the electrical crosstalk simulation result. The photocurrent value is an amount of current generated in the image sensor when the image sensor receives light. The quantum efficiency is a ratio between the number of photons incident on the image sensor and the number of photons activating the pixel array of the image sensor. The electrical crosstalk of the image sensor will be further described with reference to FIGS. 3, 4, and 5.

As a result, the final simulation result may include simulation results of the color filter crosstalk, the optical crosstalk, the electrical crosstalk, the photocurrent in the image sensor, and the quantum efficiency of the image sensor.

Referring to FIG. 2, a process simulation result is generated (S210) such that the process simulation result includes a doping profile of a silicon substrate of the image sensor. Generating the process simulation result (S210) is the same as described with reference to FIG. 1, and the repeated description is omitted.

A structure simulation result is generated (S220) with respect to BEOL structure is formed by a BEOL process of the image sensor. Generating the structure simulation result (S220) is the same as described with reference to FIG. 1, and the repeated description is omitted.

A merged simulation result is generated (S230) by merging the process simulation result and the structure simulation result.

An optical crosstalk simulation result of the image sensor is generated (S240) based on the structure simulation result and an optical mesh. Generating the optical crosstalk simulation result (230) is the same as described with reference to FIG. 1, and the repeated description is omitted.

A merged result is generated (S250) by merging the optical crosstalk simulation result and the merged simulation result. The merged result is extended to an extended result (S260) by using the optical crosstalk simulation result or the merged simulation result. A segmented result for each pixel is generated (S270) based on the extended result. The extending and segmenting process will be further described with reference to FIGS. 4, 5 and 6.

A final simulation result is generated (S280) based on the segmented result for each pixel such that the final simulation result includes an electrical simulation. Generating the final simulation result (S280) is the same as described with reference to FIG. 1, and the repeated description is omitted.

As a result, the final simulation result may include simulation results of the color filter crosstalk, the optical crosstalk, the electrical crosstalk, the photocurrent in the image sensor, and the quantum efficiency of the image sensor. The final simulation result may be obtained in reduced running time by using reduced required memory amount.

Figure 3:
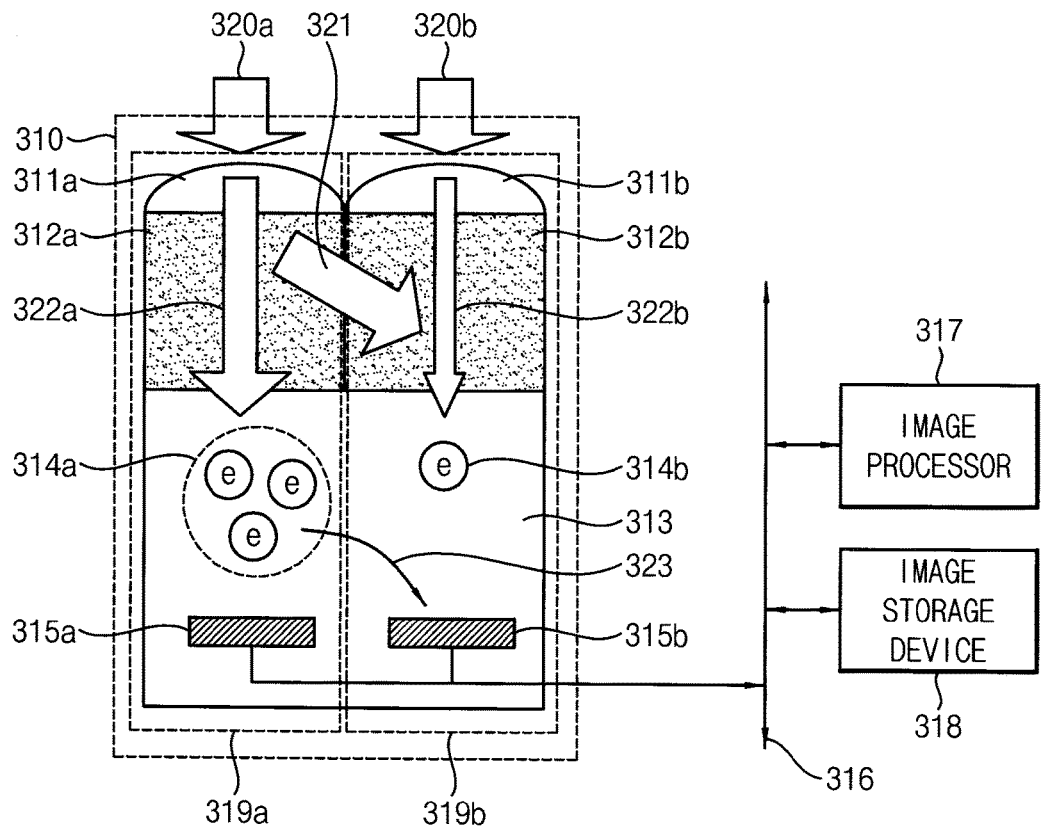
FIG. 3 is a diagram for describing crosstalks among neighboring pixels in an image sensor.

FIG. 3 is a diagram for describing crosstalks among neighboring pixels in an image sensor. A conceptual structure of the image sensor is illustrated in FIG. 3.

Referring to FIG. 3, an image sensor 300 includes pixel array 310, interconnection metal lines 316, an image processor 317, and an image storage 318 such as a memory. The pixel array 310 includes micro-lenses 311a and 311b, color filters 312a and 312b, and a silicon substrate 313. The silicon substrate 313 includes photodiodes 315a and 315b. For the convenience of description and illustration, a vertical structure of two pixels 319a and 319b is illustrated in FIG. 3, but the pixel array 310 may include three or more pixels.

Light 320a incident on the first pixel 319a passes through the micro-lens 311a and the color filter 312a. Light 322a having passed through color filter 312a generates an electron-hole pair 314a in the silicon substrate 313. When the photo-electron of the electron-hole pair 314a is transferred to the photodiode 315a, the photodiode 315a provides electrical signals corresponding to the electron-hole pair 314a to the image processor 317 or the image storage 318 through the interconnection metal line 316.

Light 320b incident on the second pixel 319b next to the first pixel 319a, passes through the micro-lens 311b and the color filter 312b. Light 322b having passed through the color filter 312b generates electron-hole pair 314b in the silicon substrate 313. When the photo-electron of the electron-hole pair 314b is transferred to the photodiode 315b, the photodiode 315b provides electrical signals corresponding to the electron-hole pair 314b to the image processor 317 or the image storage 318 through the interconnection metal lines 316.

Crosstalks generated in the pixel array 310 include color filter crosstalk, optical crosstalk 321, and electrical crosstalk 323. Color filter crosstalk is generated when the light 322a, which has intensity larger than the intensity of ordinary light 322b, includes a light component of unexpected wavelength caused by non-ideal band-pass optical transmittance of color filters 312a and 312b and passes through the color filter 312a. Optical crosstalk 321 is generated when the light 320a, which is incident on the first pixel 319a, spreads out and reaches the second pixel 319b due to the reflection, refraction, and diffraction effects caused by a periodic arrangement of the image sensor.

Electrical crosstalk 323 is generated when the photoelectrons of the electron-hole pair 314a generated in the first pixel 319a overflow and moves to the photodiode 315b of the second pixel 319b by diffusion process.

Exact prediction of color filter crosstalk, optical crosstalk 321, and electrical crosstalk 323 requires three-dimensional (3-D) optoelectrical simulation for the entire pixel array, and not just for a pixel.

Figure 4:
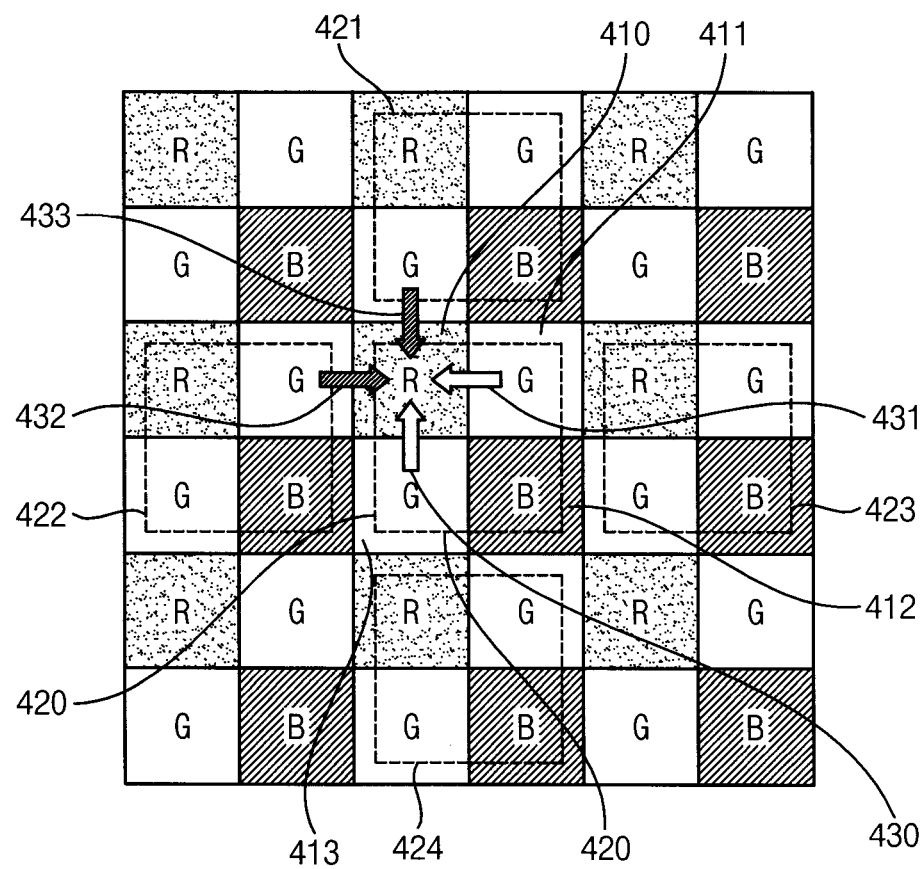
FIGS. 4, 5, and 6 are diagrams illustrating pixel arrays for describing a method of 3-D optoelectrical simulation of an image sensor according to exemplary embodiments.
Figure 5:
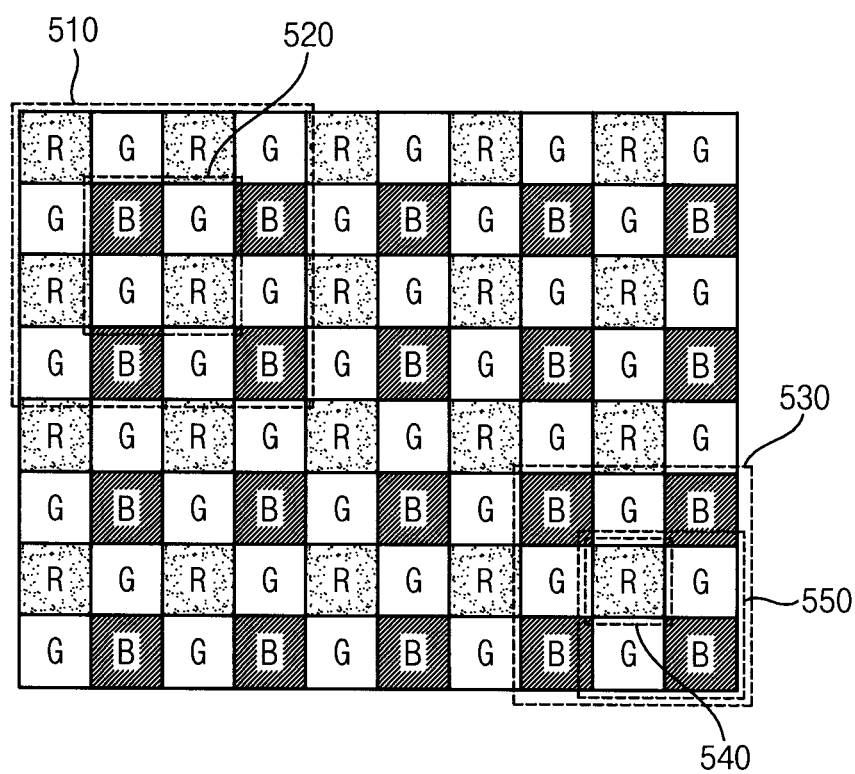
Figure 6:
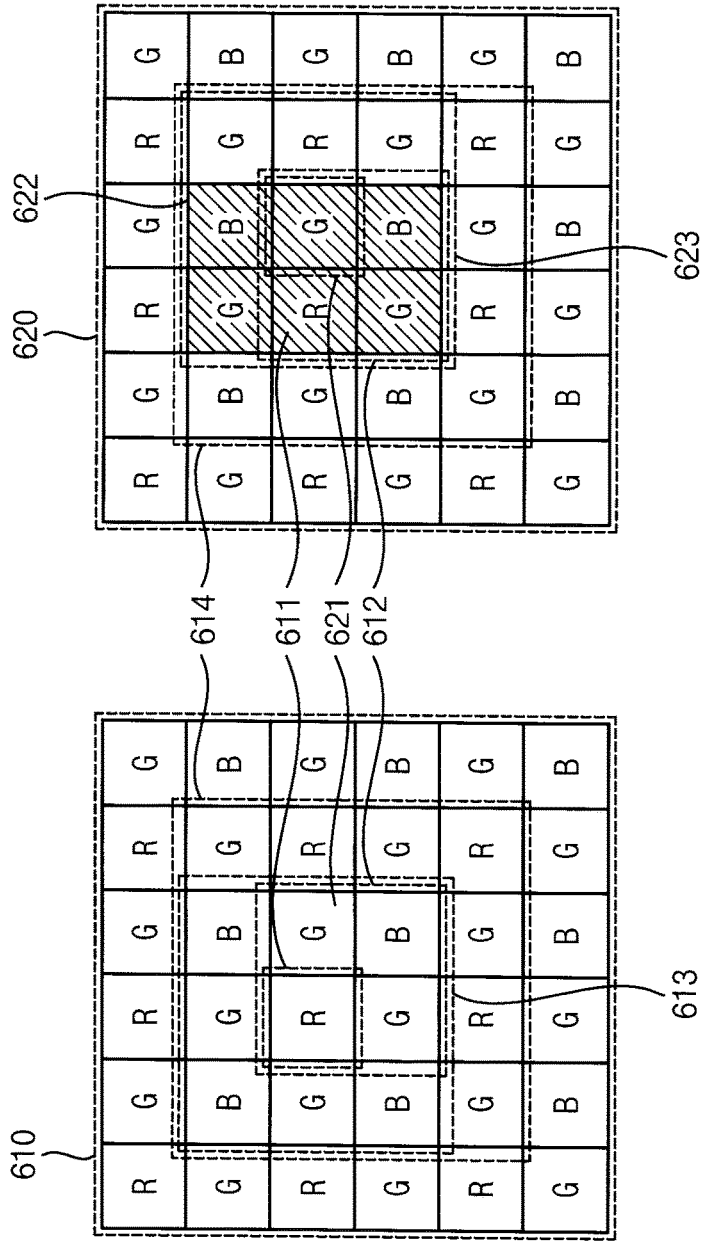

FIGS. 4, 5, and 6 are diagrams illustrating pixel arrays for describing a method of 3-D optoelectrical simulation of an image sensor according to exemplary embodiments.

Referring FIG. 4, a pixel array 400 of the image sensor includes nine 2×2 pixel arrays, including 2×2 pixel arrays 420, 421, 422, 423, 424 indicated as examples in FIG. 4. Each of the nine 2×2 pixel arrays may have a bayer pattern. The first 2×2 pixel array 420 has a R(Red) filter pixel 410, a first G(Green) filter pixel 411, a second G filter pixel 413, and a B(Blue) filter pixel 412.

A pixel array of the general image sensor may be designed in the unit of 2×2 pixel array, and thus the 3-D optoelectrical simulation for the pixel array of the general image sensor may be generally executed for the 2×2 pixel array. Hereinafter, a method of crosstalk simulation of the first 2×2 pixel array 420 of the image sensor will be described.

Exact prediction of crosstalk of the first 2×2 pixel array 420 requires simulations for color filter crosstalk of a 4×4 pixel array, optical crosstalk 321 of the 4×4 pixel array, and electrical crosstalk 323 of the 4×4 pixel array, such that the 4×4 pixel array includes the first 2×2 pixel array 420 at the center.

Color filter crosstalk for each pixel of the first 2×2 pixel array 420 may be exactly predicted using the BEOL structure including the color filters, without considering an effect from neighboring pixels of the first 2×2 pixel array 420, through optical crosstalk simulation using measured values of complex refractive indices of R, G, B filters.

Exact prediction of the optical crosstalk of the first 2×2 pixel array 420 may be obtained by using periodic boundary condition to the first 2×2 pixel array 420 because the eight 2×2 pixel arrays, which are adjacent to the first 2×2 pixel array 420, have the same structure as the first 2×2 pixel array 420. For the R filter pixel 410, a first optical crosstalk 431, which is transferred from the first G filter pixel 411, and a second crosstalk 430, which is transferred from the second G filter pixel 413, may be exactly predicted in the first 2×2 pixel array 420. A third optical crosstalk 432, which is transferred from a G filter pixel bordering left side of the R filter pixel 410, and a fourth optical crosstalk 433, which is transferred from another G filter pixel bordering upper side of the R filter pixel 410, may be obtained by using data of the first 2×2 pixel array 420 because boundaries of the first 2×2 pixel array 420 are repeated horizontally and vertically.

Electrical crosstalk of a first pixel, which is included in the first 2×2 pixel array 420, may be obtained by combining partial electrical crosstalks transferred from 8 pixels surrounding the first pixel. In general, it is difficult to reuse an electrical crosstalk simulation result because the electrical crosstalk of the first pixel can be reused for a second pixel only if meshes and process simulation results of the 8 pixels surrounding the first pixel are the same as meshes and process simulation results of other 8 pixels surrounding the second pixel. Exact electrical crosstalk simulation of the first 2×2 pixel array 420 requires 4 times of electrical crosstalk simulation results of every pixel in the first 2×2 pixel array 420.

The method of three-dimensional (3-D) optoelectrical simulation described in a flow chart of FIG. 1 may include a first method and a second method of 3-D optoelectrical simulation, as will be described below.

Referring FIG. 5, a pixel array 500 of the image sensor is illustrated. In the first method of 3-D optoelectrical simulation of a 2×2 pixel array 520, the process simulation result of a 4×4 pixel array 510 may be generated, and the structure simulation result of the 4×4 pixel array 510 may be generated. The merged result of the 4×4 pixel array 510 may be generated by merging the process simulation result of the 4×4 pixel array 510 and the structure simulation result of the 4×4 pixel array 510. The segmented result for each pixel of the 4×4 pixel array 510 may be generated based on the merged result of 4×4 pixel array 510. The optical crosstalk simulation result of the 4×4 pixel array 510 may be generated based on the structure simulation result of the 4×4 pixel array 510 and the optical mesh. The final simulation result for the 2×2 pixel array 520 is generated based on the segmented result for each pixel of the 4×4 pixel array 510 and the optical crosstalk simulation result of the 4×4 pixel array 510 such that the final simulation result includes the electrical crosstalk simulation result of the 2×2 pixel array 520.

In the second method of 3-D optoelectrical simulation of the 2×2 pixel array 520, the process simulation result of the 2×2 pixel array 520 may be generated and the structure simulation result of the 4×4 pixel array 510 may be generated. The merged result of the 4×4 pixel array 510 may be generated by merging the process simulation result of the 2×2 pixel array 520 and the structure simulation result of the 4×4 pixel array 510. The merged result of the 4×4 pixel array 510 may be extended to the extended result of the 4×4 pixel array 510 including an extended process simulation result of the 4×4 pixel array 510 such that the extended process simulation result is formed by using the process simulation result of the 2×2 pixel array 520. The segmented result for each pixel of the 4×4 pixel array 510 may be generated based on the extended result of the 4×4 pixel array 510. The optical crosstalk simulation result of the 4×4 pixel array 510 may be generated based on the structure simulation result of the 4×4 pixel array 510 and the optical mesh. The final simulation result for the 2×2 pixel array 520 is generated based on the segmented result for each pixel of the 4×4 pixel array 510 and the optical crosstalk simulation result of the 4×4 pixel array 510 such that the final simulation result includes the electrical crosstalk simulation result of the 2×2 pixel array 520.

The method of 3-D optoelectrical simulation described in the flow chart of FIG. 2 may include a third method, a fourth method and a fifth method of 3-D optoelectrical simulation, as will be described below.

In the third method of 3-D optoelectrical simulation of the 2×2 pixel array 520, the process simulation result of the 4×4 pixel array 510 may be generated and the structure simulation result of the 4×4 pixel array 510 may be generated. The merged simulation result of the 4×4 pixel array 510 may be generated by merging the process simulation result of the 4×4 pixel array 510 and the structure simulation result of the 4×4 pixel array 510. The optical crosstalk simulation result of the 2×2 pixel array 520 may be generated based on the structure simulation result of the 4×4 pixel array 510 and the optical mesh. The merged result of the 4×4 pixel array 510 may be generated by merging the optical crosstalk simulation result of the 2×2 pixel array 520 and the merged simulation result of the 4×4 pixel array 510. The merged result of the 4×4 pixel array 510 may be extended to an extended result of the 4×4 pixel array 510 including the extended optical crosstalk simulation result of the 4×4 pixel array 510 such that the extended optical crosstalk simulation result is formed by using the optical crosstalk simulation result of the 2×2 pixel array 520. The segmented result for each pixel of the 4×4 pixel array 510 may be generated based on the extended result of the 4×4 pixel array 510. The final simulation result of the 2×2 pixel array 520 may be generated based on the segmented result for each pixel of the 4×4 pixel array 510.

In the fourth method of 3-D optoelectrical simulation of a first pixel 540, the process simulation result of a 2×2 pixel array 550 may be generated and the structure simulation result of the 2×2 pixel array 550 may be generated. The merged simulation result of the 2×2 pixel array 550 may be generated by merging the process simulation result of the 2×2 pixel array 550 and the structure simulation result of the 2×2 pixel array 550. The optical crosstalk simulation result of the 2×2 pixel array 550 may be generated based on the structure simulation result of the 2×2 pixel array 550 and the optical mesh. The merged result of the 2×2 pixel array 550 may be generated by merging the optical crosstalk simulation result of the 2×2 pixel array 550 and the merged simulation result of the 2×2 pixel array 550. The merged result of the 2×2 pixel array 550 may be extended to an extended result of a 3×3 pixel array 530, such that the extended result is formed by using the merged result of the 2×2 pixel array 550. The segmented result for each pixel of the 3×3 pixel array 530 may be generated based on the extended result of the 3×3 pixel array 530. The final simulation result of the first pixel 540 may be generated based on the segmented result for each pixel of the 3×3 pixel array 530.

Referring to FIG. 6, pixel arrays 600 of the image sensor are illustrated. A first pixel array 610 and a second pixel array 620 illustrate the same portion of the image sensor. The first pixel array 610 will be used for describing the electrical crosstalk of a R filter pixel 611. The second pixel array 620 will be used for describing the electrical crosstalk of a first G filter pixel 621 bordering the right side of R filter pixel 611.

Electrical crosstalk simulation of a 2×2 pixel array 612 requires 4 times of executing of the fourth method of 3-D optoelectrical simulation for the R filter pixel 611, the first G filter pixel 621, a second G filter pixel bordering a lower side of R filter pixel 611, and a B filter pixel bordering a lower side of the first G filter pixel 621. Hereinafter, the fourth method for the R filter pixel 611 and the first G filter pixel 621 will be described. The second G filter pixel and the B filter pixel are the same as the R filter pixel 611 and the first G filter pixel 621, and the repeated description is omitted.

A first electrical crosstalk simulation for the R filter pixel 611 and a second electrical crosstalk simulation for the first G filter pixel 621 may be sequentially executed in logical order or temporal order. There may be a logical gap or a temporal gap between execution of the first electrical crosstalk simulation and execution of the second electrical crosstalk simulation. The first electrical crosstalk simulation may be executed before the second electrical crosstalk simulation or may be executed after the second electrical crosstalk simulation. For the convenience of description, a case that the first electrical crosstalk simulation may be executed before the second electrical crosstalk simulation will be described.

The fourth method may be applied to the R filter pixel 611 and the first G filter pixel 621. The fourth method of the R filter pixel 611 may use the segmented result for each pixel of a 3×3 pixel array 613 to the electrical crosstalk simulation of the R filter pixel 611 such that the segmented result for each pixel is formed by using the process simulation result of the 2×2 pixel array 612, the structure simulation result of the 2×2 pixel array 612, and the optical crosstalk simulation result of the 2×2 pixel array 612. The fourth method of the first G filter pixel 621 may use the segmented result for each pixel of a 3×3 pixel array 623 to the electrical crosstalk simulation of the first G filter pixel 621, such that the segmented result for each pixel is formed by using the process simulation result of the 2×2 pixel array 612, the structure simulation result of the 2×2 pixel array 612, and the optical crosstalk simulation result of the 2×2 pixel array 612.

When the fourth method of the R filter pixel 611 and the fourth method of the first G filter pixel 621 are separately performed, execution of the electrical crosstalk simulation of the 2×2 pixel array 612 needs more running time and more required memory to run simulation because the process simulation result of a slashed pixel array 622, the structure simulation result of the slashed pixel array 622, and the optical crosstalk simulation result of the slashed pixel array 622 cannot be reused.

In the fifth method of 3-D optoelectrical simulation of the 2×2 pixel array 612, the process simulation result of the 2×2 pixel array 612 may be generated and the structure simulation result of the 2×2 pixel array 612 may be generated. The merged simulation result of the 2×2 pixel array 612 may be generated by merging the process simulation result of the 2×2 pixel array 612 and the structure simulation result of the 2×2 pixel array 612. The optical crosstalk simulation result of the 2×2 pixel array 612 may be generated based on the structure simulation result of the 2×2 pixel array 612 and the optical mesh. The merged result of the 2×2 pixel array 612 may be generated by merging the optical crosstalk simulation result of the 2×2 pixel array 612 and the merged simulation result of the 2×2 pixel array 612. The merged result of the 2×2 pixel array 612 may be extended to an extended result of a 4×4 pixel array 614 such that the extended result is formed by using the merged result of the 2×2 pixel array 612. The segmented result for each pixel of the 4×4 pixel array 614 may be generated based on the extended result of the 4×4 pixel array 614. The final simulation result of the 2×2 pixel array 612 may be generated based on the segmented result for each pixel of the 4×4 pixel array 614.

The fifth method of the 2×2 pixel array 612 needs less running time and less required memory to perform simulation than 4 times of separately performing the fourth method for the R filter pixel 611, the first G filter pixel 621, the second G filter pixel, and the B filter pixel because the process simulation result of the slashed pixel array 622, the structure simulation result of the slashed pixel array 622, and the optical crosstalk simulation result of the slashed pixel array 622 can be reused.

Among the R filter pixel 611, the first G filter pixel 621, the second G filter pixel and the B filter pixel, there may be other pixel arrays corresponding to the slashed pixel array 622 between the R filter pixel 611 and the first G filter pixel 621. The other pixel arrays are the same as described with respect to the slashed pixel array 622 and the repeated description is omitted.

Figure 7:
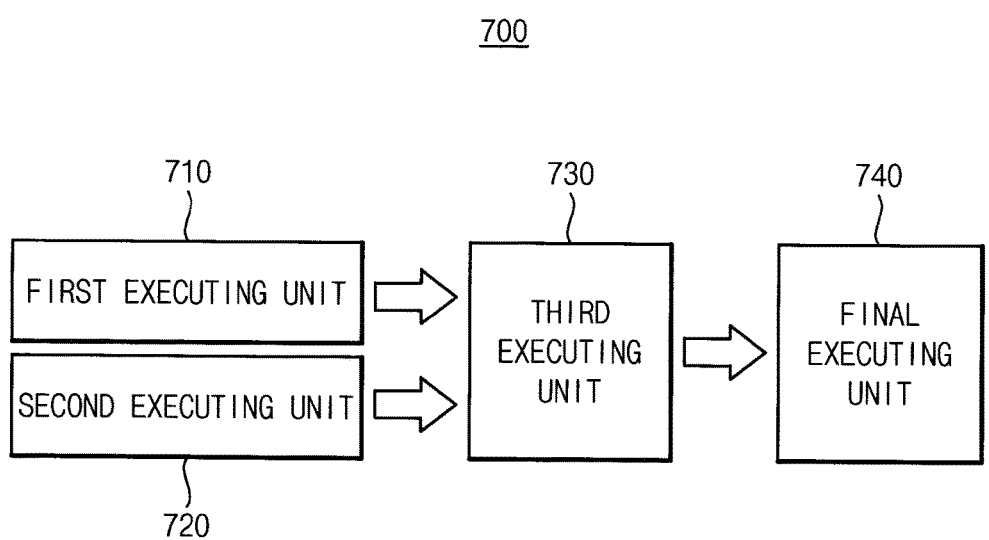
FIG. 7 is a block diagram illustrating an apparatus of performing a method of 3-D optoelectrical simulation of an image sensor according to an exemplary embodiment.

FIG. 7 is a block diagram illustrating an apparatus of performing a method of 3-D optoelectrical simulation of an image sensor according to an exemplary embodiment.

Referring to FIG. 7, an apparatus 700 for performing a method of 3-D optoelectrical simulation of an image sensor according to an exemplary embodiment includes a first executing unit 710, a second executing unit 720, a third executing unit 730 and a final executing unit 740. The first executing unit 710 may generate the process simulation result (S110) or generate the process simulation result (S210). The second executing unit 720 may generate the structure simulation result (S120) or generate the structure simulation result (S220). The third executing unit 730 may generate the merged result (S130), extend the merged result to an extended result (S140), generate the segmented result for each pixel (S150), generate the optical crosstalk simulation result (S160). In other case, the third executing unit 730 may generate the merged simulation result (S230), generate the optical crosstalk simulation result (S240), generate the merged result (S250), extend the merged result to an extended result (S260), generate the segmented result for each pixel (S270). The final executing unit 740 may generate the final simulation result (S170) or generate the final simulation result (S280).

The first executing unit 710, the second executing unit 720, the third executing unit 730 and the fourth executing unit 740 may be implemented as software or hardware, which may be any combination of software and/or hardware components, such as a Field Programmable Gate Array (FPGA) or Application Specific Integrated Circuit (ASIC), which performs certain tasks. A unit or module may advantageously be configured to reside on the addressable storage medium and configured to execute on one or more processors or microprocessors. Thus, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. For example, the units of FIG. 7 may be embodied as any combination of programmable logic elements or software elements of the processor. The functionality provided for in the components and units may be combined into fewer components and units or modules or further separated into additional components and units or modules.

Exemplary embodiments of the inventive concept may be applied to crosstalk simulation of an image sensor during designing the image sensor.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An apparatus for performing a three-dimensional optoelectrical simulation of an image sensor, the apparatus comprising:
   a storage device; and
   a processor interoperable with the storage device to
      generate a process simulation result including a doping profile of a silicon substrate of the image sensor;
      generate a structure simulation result with respect to a back end of line (BEOL) structure formed by a BEOL process of the image sensor;
      generate a merged result by merging the process simulation result and the structure simulation result;
      generate an extended result based on the merged result by using the process simulation result;
      generate a segmented result for each pixel based on the extended result;
      generate an optical crosstalk simulation result of the image sensor based on the structure simulation result and an optical mesh; and
      generate a final simulation result including an electrical crosstalk simulation result of the image sensor based on the segmented result for each pixel and the optical crosstalk simulation result.

2. The apparatus of claim 1, wherein the final simulation result further includes a photocurrent value of the image sensor and a quantum efficiency of the image sensor.

3. The apparatus of claim 1, wherein the BEOL structure includes interconnection metal lines.

4. The apparatus of claim 3, wherein the BEOL structure further includes a micro-lens of the image sensor.

5. The apparatus of claim 4, wherein the BEOL structure further includes a color filter of the image sensor.

6. The apparatus of claim 1, wherein the method is performed for a 4×4 pixel array included in the image sensor.

7. The apparatus of claim 1, wherein the processor is interoperable with the storage device to
   generate the process simulation result based on generating the process simulation result of a 2×2 pixel array,
   generate the structure simulation result based on generating the structure simulation result of a 4×4 pixel array, the 4×4 pixel array including the 2×2 pixel array at a center of the 4×4 pixel array,
   generate the extended result based on generating the extended result of the 4×4 pixel array including an extended process simulation result of the 4×4 pixel array, the extended process simulation result being formed by using the process simulation result of the 2×2 pixel array,
   generate the segmented result based on generating the segmented result for each pixel of the 4×4 pixel array based on the extended result of the 4×4 pixel array,
   generate the optical crosstalk simulation result based on generating the optical crosstalk simulation result of the 4×4 pixel array, and
   generate the final simulation result based on generating the final simulation result of the 2×2 pixel array based on the segmented result for each pixel of the 4×4 pixel array and the optical crosstalk simulation result of the 4×4 pixel array.

8. An apparatus for performing a three-dimensional optoelectrical simulation of an image sensor, the apparatus comprising:
a storage device; and
a processor interoperable with the storage device to
generate a process simulation result including a doping profile of a silicon substrate of the image sensor;
generate a structure simulation result with respect to a back end of line (BEOL) structure that is formed by a BEOL process of the image sensor;
generate a merged simulation result by merging the process simulation result and the structure simulation result;
generate an optical crosstalk simulation result of the image sensor based on the structure simulation result and an optical mesh;
generate a merged result by merging the optical crosstalk simulation result and the merged simulation result;
generate an extended result based on the merged result by using the optical crosstalk simulation result;
generate a segmented result for each pixel based on the extended result; and
generate a final simulation result including an electrical crosstalk simulation result of the image sensor based on the segmented result for each pixel.

9. The apparatus of claim 8, wherein the final simulation result further includes a photocurrent value of the image sensor and a quantum efficiency of the image sensor.

10. The apparatus of claim 8, wherein the processor is interoperable with the storage device to
generate the process simulation result based on generating the process simulation result for a 4×4 pixel array of the image sensor including a 2×2 pixel array at a center of the 4×4 pixel array,
generate the structure simulation result based on generating the structure simulation result for the 4×4 pixel array,
generate the merged simulation result based on generating the merged simulation result for the 4×4 pixel array,
generate the optical crosstalk simulation result based on generating the optical crosstalk simulation result of the 2×2 pixel array,
generate the extended result based on generating the extended result of the 4×4 pixel array including an extended optical crosstalk simulation result of the 4×4 pixel array, the extended optical crosstalk simulation result being formed by using the optical crosstalk simulation result of the 2×2 pixel array,
generate the segmented result based on generating the segmented result for each pixel of the 4×4 pixel array based on the extended result of the 4×4 pixel array, and
generate the final simulation result based on generating the final simulation result of the 2×2 pixel array based on the segmented result for each pixel of the 4×4 pixel array.

11. The apparatus of claim 8, wherein the processor is interoperable with the storage device to
generate the process simulation result based on generating the process simulation result for a 2×2 pixel array of the image sensor including a one pixel,
generate the structure simulation result based on generating the structure simulation result for the 2×2 pixel array,
generate the merged simulation result based on generating the merged simulation result for the 2×2 pixel array, and
generate the optical crosstalk simulation result based on generating the optical crosstalk simulation result for the 2×2 pixel array,
generate the extended result based on generating the extended result of a 3×3 pixel array including the one pixel at the center, the extended result being formed by using the merged result of the 2×2 pixel array,
generate the segmented result based on generating the segmented result for each pixel of the 3×3 pixel array based on the extended result of the 3×3 pixel array,
generate the final simulation result based on generating the final simulation result of the one pixel based on the segmented result for each pixel of the 3×3 pixel array.

12. The apparatus of claim 8, wherein the processor is interoperable with the storage device to
generate the process simulation result based on generating the process simulation result for a 2×2 pixel array of the image sensor located at a center of a 4×4 pixel array,
generate the structure simulation result based on generating the structure simulation result for the 2×2 pixel array,
generate the merged simulation result based on generating the merged simulation result for the 2×2 pixel array,
generate the optical crosstalk simulation result based on generating the optical crosstalk simulation result for the 2×2 pixel array,
generate the extended result based on generating the extended result of the 4×4 pixel array, the extended result being formed by using the merged result of the 2×2 pixel array,
generate the segmented result based on generating the segmented result for each pixel of the 4×4 pixel array based on the extended result of the 4×4 pixel array,
generate the final simulation result based on generating the final simulation result of the 2×2 pixel array based on the segmented result for each pixel of the 4×4 pixel array.

* * * * *